US011021626B2

(12) United States Patent
Otani et al.

(10) Patent No.: US 11,021,626 B2
(45) Date of Patent: Jun. 1, 2021

(54) CONDUCTIVE PASTE

(71) Applicant: SUMITOMO BAKELITE CO., LTD., Tokyo (JP)

(72) Inventors: Mariko Otani, Tokyo (JP); Shun Hayakawa, Tokyo (JP); Akihiro Horimoto, Tokyo (JP); Mayo Miyachi, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 16/771,274

(22) PCT Filed: Sep. 26, 2018

(86) PCT No.: PCT/JP2018/035653
§ 371 (c)(1),
(2) Date: Jun. 10, 2020

(87) PCT Pub. No.: WO2019/123752
PCT Pub. Date: Jun. 27, 2019

(65) Prior Publication Data
US 2020/0377749 A1  Dec. 3, 2020

(30) Foreign Application Priority Data

Dec. 20, 2017  (JP) .............................. JP2017-243901

(51) Int. Cl.
*H01B 1/22* (2006.01)
*C08K 3/00* (2018.01)
(Continued)

(52) U.S. Cl.
CPC .............. *C09D 11/52* (2013.01); *C08F 22/22* (2013.01); *C08G 77/20* (2013.01); *C08K 3/08* (2013.01); *C08K 3/36* (2013.01); *C09D 11/033* (2013.01); *C09D 11/037* (2013.01); *C09D 11/102* (2013.01); *C09D 11/107* (2013.01);
(Continued)

(58) Field of Classification Search
CPC ... H01B 1/00; H01B 1/22; H01B 1/24; C08K 3/08; C08L 83/04; H05K 1/09
See application file for complete search history.

(56) References Cited

U.S. PATENT DOCUMENTS

| 4,461,854 A * | 7/1984 | Smith ....................... C08K 9/10 523/211 |
| 5,227,093 A * | 7/1993 | Cole ......................... C08K 9/04 106/1.18 |
| 6,361,716 B1 * | 3/2002 | Kleyer .................. C08K 5/0091 252/514 |
| 7,141,183 B2 * | 11/2006 | Hattori ................... C08L 23/16 252/500 |

(Continued)

FOREIGN PATENT DOCUMENTS

| JP | 2007-173226 | 7/2007 |
| JP | 2015-055615 | 3/2015 |

(Continued)

OTHER PUBLICATIONS

International Search Report and Written Opinion for International Application No. PCT/JP2018/035653 dated Nov. 20, 2018; 11 pages.

*Primary Examiner* — Mark Kopec
(74) *Attorney, Agent, or Firm* — Amin, Turocy & Watson, LLP

(57) ABSTRACT

A conductive paste of the present invention includes an elastomer composition containing silica particles (C), a conductive filler, and a solvent.

20 Claims, 4 Drawing Sheets

(51) Int. Cl.
*C09D 11/52* (2014.01)
*C08F 22/22* (2006.01)
*C08G 77/20* (2006.01)
*C08K 3/08* (2006.01)
*C08K 3/36* (2006.01)
*C09D 11/033* (2014.01)
*C09D 11/037* (2014.01)
*C09D 11/102* (2014.01)
*C09D 11/107* (2014.01)

(52) U.S. Cl.
CPC ....... *H01B 1/22* (2013.01); *C08K 2003/0806* (2013.01); *C08K 2201/001* (2013.01); *C08K 2201/005* (2013.01); *C08K 2201/006* (2013.01)

(56) References Cited

U.S. PATENT DOCUMENTS

| | | | |
|---|---|---|---|
| 2006/0276584 A1* | 12/2006 | Todoroki | H01B 1/22 524/588 |
| 2010/0239871 A1* | 9/2010 | Scheffer | C09D 183/04 428/447 |
| 2016/0130471 A1 | 5/2016 | Burrows et al. | |

FOREIGN PATENT DOCUMENTS

| | | |
|---|---|---|
| JP | 2015-178597 | 10/2015 |
| JP | 2017-082125 | 5/2017 |
| JP | 2017-117861 | 6/2017 |
| WO | 2016/073465 | 5/2016 |

* cited by examiner

CONDUCTIVE PASTE

TECHNICAL FIELD

The present invention relates to a conductive paste.

BACKGROUND ART

In recent years, a variety of development efforts regarding materials used for wires configuring stretchable wiring substrates have been underway. As this type of technique, for example, a technique described in Patent Document 1 is known. According to the same publication, it is described that a binder rubber polymer and conductive powder are mixed together at a mass ratio of 2:8 and dispersed using a triple roll mill, and then the viscosity is adjusted using a solvent, thereby producing a conductive paste (Paragraph 0037 of Patent Document 1).

RELATED DOCUMENT

Patent Document

[Patent Document 1] Japanese Unexamined Patent Publication No. 2015-55615

SUMMARY OF THE INVENTION

However, as a result of present inventors' studies, it was clarified that, for the conductive paste described in the above-described publication, there is room for improvement in terms of printability or stretch durability.

As a result of additional studies, the present inventors found that, when silica particles are further added to a conductive paste containing a conductive filler, it is possible to improve printability or stretch durability in conductive resin films such as wires for which the conductive paste is used and completed the present invention.

According to the present invention, there is provided a conductive paste including an elastomer composition containing silica particles (C), a conductive filler, and a solvent.

According to the present invention, it is possible to provide a conductive paste being excellent in terms of printability or stretch durability.

BRIEF DESCRIPTION OF THE DRAWINGS

The above-described object, other objects, features, and advantages will be further clarified using a preferred embodiment described below and the following drawings attached thereto.

DESCRIPTION OF EMBODIMENTS

Figure 1:
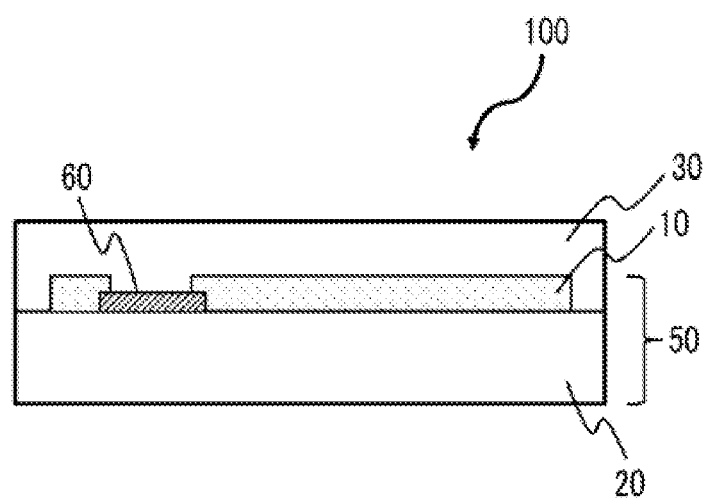
FIG. 1 is a cross-sectional view schematically showing an electronic device in a present embodiment.

Hereinafter, an embodiment of the present invention will be described using drawings. In all of the drawings, the same configuration element will be given the same reference sign and will not be repeated. In addition, in the present specification, "to" indicates equal to or more than and equal to or less than unless particularly otherwise described.

The brief overview of a conductive paste of the present embodiment will be described.

The conductive paste of the present embodiment is capable of including an elastomer composition containing silica particles (C), a conductive filler, and a solvent.

The conductive paste of the present embodiment is made of a paste-form conductive resin composition including a solvent and is thus excellent in terms of a property of being applied onto a substrate or a property of forming a film on a substrate and excellent in terms of printability in screen printing and the like. Therefore, the conductive paste of the present embodiment can be suitable for, for example, uses of the formation of wires configuring stretchable wiring substrates.

The conductive paste of the present embodiment contains silica particles in addition to a conductive filler and is thus capable of improving the mechanical strength or durability of a cured substance of the conductive paste. When a conductive resin film such as a wire configuring a stretchable wiring substrate is produced using the above-described conductive paste, it is possible to improve the mechanical strength or durability of the conductive resin film. Therefore, it is possible to enhance the stretch electric characteristic of a stretchable wiring substrate including a wire formed of the conductive paste of the present embodiment.

Hereinafter, the respective components of the conductive paste of the present embodiment will be described.

The conductive paste of the present embodiment is capable of including an elastomer composition. Therefore, even when a wire or the like is produced using the conductive paste, it is possible to develop an appropriate stretch property for the wire. In addition, the conductive paste of the present embodiment is capable of containing silica particles (C). Therefore, it is possible to improve the durability or mechanical strength of the wire.

The elastomer composition is a substance used for the formation of the above-described conductive resin film, is capable of including, for example, a thermosetting elastomer composition used for the formation of one or more thermosetting elastomers selected from the group consisting of silicone rubber, urethane rubber, and fluorine rubber, and is preferably capable of including a silicone rubber-based curable composition.

(Elastomer)

As the elastomer, it is possible to use silicone rubber, urethane rubber, fluorine rubber, nitrile rubber, acrylic rubber, styrene rubber, chloroprene rubber, ethylene propylene rubber, or the like. Among these, the elastomer is capable of including one or more thermosetting elastomers selected from the group consisting of silicone rubber, urethane rubber, and fluorine rubber. In addition, the elastomer is chemically stable and is capable of including silicone rubber from the viewpoint of its excellent mechanical strength.

The thermosetting elastomer can be made of a cured substance of a thermosetting elastomer composition. For example, the silicone rubber can be made of a cured substance of a silicone rubber-based curable composition. A thermoplastic elastomer can be made of a dried substance of a thermoplastic elastomer. In the present specification, an elastomer made of a conductive paste refers to a conductive elastomer formed by drying or curing the conductive paste.

Hereinafter, the case of using a silicone rubber-based curable composition as silicone rubber, which is an example of the elastomer of the present embodiment, will be described.

The silicone rubber-based curable composition of the present embodiment is capable of including a vinyl group-containing organopolysiloxane (A). The vinyl group-containing organopolysiloxane (A) is a polymer that serves as a main component of the silicone rubber-based curable composition of the present embodiment.

The vinyl group-containing organopolysiloxane (A) is capable of including a vinyl group-containing straight-chain organopolysiloxane (A1) having a straight-chain structure.

The vinyl group-containing straight-chain organopolysiloxane (A1) has a straight-chain structure and contains a vinyl group, and such a vinyl group serves as a crosslinking point during the curing of the vinyl group-containing straight-chain organopolysiloxane.

The content of the vinyl group in the vinyl group-containing straight-chain organopolysiloxane (A1) is not particularly limited, but is preferably two or more vinyl groups in the molecule and equal to or less than 15 mol % and more preferably 0.01 to 12 mol %. In such a case, the amount of the vinyl group in the vinyl group-containing straight-chain organopolysiloxane (A1) is optimized, and it is possible to reliably form a network with individual components described below. In the present embodiment, "to" used to express a numerical range indicates that numerical values on both ends are included in the range.

In the present specification, a vinyl group content refers to the mol % of a vinyl group-containing siloxane unit when all units configuring the vinyl group-containing straight-chain organopolysiloxane (A1) is regarded as 100 mol %. Here, one vinyl group-containing siloxane unit is considered to be one vinyl group.

In addition, the degree of polymerization of the vinyl group-containing straight-chain organopolysiloxane (A1) is not particularly limited, but is, for example, in a range of preferably approximately 1,000 to 10,000 and more preferably approximately 2,000 to 5,000. The degree of polymerization can be obtained as, for example, the polystyrene-equivalent number-average degree of polymerization (or number-average molecular weight) or the like in gel permeation chromatography (GPC) in which chloroform is used as a developing solvent.

Furthermore, the specific gravity of the vinyl group-containing straight-chain organopolysiloxane (A1) is not particularly limited, but is preferably in a range of approximately 0.9 to 1.1.

When an organopolysiloxane having a degree of polymerization and a specific gravity in the above-described ranges is used as the vinyl group-containing straight-chain organopolysiloxane (A1), it is possible to improve the heat resistance, flame retardancy, chemical stability, and the like of silicone rubber to be obtained.

As the vinyl group-containing straight-chain organopolysiloxane (A1), particularly, an organopolysiloxane having a structure represented by Formula (1) is preferred.

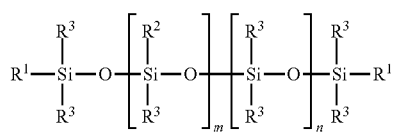

(1)

In Formula (1), $R^1$ is a substituted or unsubstituted alkyl group, alkenyl group, or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, a butenyl group, and the like are exemplified, and, among these, a vinyl group is preferred. As the aryl group having 1 to 10 carbon atoms, for example, a phenyl group and the like are exemplified.

In addition, $R^2$ is a substituted or unsubstituted alkyl group, alkenyl group, or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, a butenyl group, and the like are exemplified. As the aryl group having 1 to 10 carbon atoms, for example, a phenyl group is exemplified.

In addition, $R^3$ is a substituted or unsubstituted alkyl group or aryl group having 1 to 8 carbon atoms or a hydrocarbon group formed by combining the above-described groups. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group and the like are exemplified.

Furthermore, as a substituent in $R^1$ and $R^2$ in Formula (1), for example, a methyl group, a vinyl group, and the like are exemplified, and, as a substituent in $R^3$, for example, a methyl group and the like are exemplified.

In Formula (1), a plurality of $R^1$'s is groups independent from each other and may be different from or identical to each other. Furthermore, this is also true for $R^2$ and $R^3$.

Furthermore, m and n are the numbers of repeating units configuring the vinyl group-containing straight-chain organopolysiloxane (A1) represented by Formula (1), m is an integer of 0 to 2,000, and n is an integer of 1,000 to 10,000. m is preferably 0 to 1,000, and n is preferably 2,000 to 5,000.

In addition, as a specific structure of the vinyl group-containing straight-chain organopolysiloxane (A1) represented by Formula (1), for example, a structure represented by Formula (1-1) is exemplified.

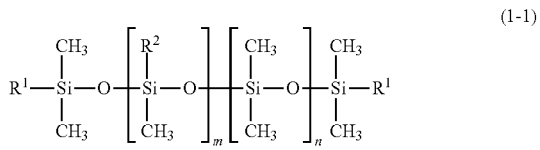

(1-1)

In Formula (1-1), $R^1$ and $R^2$ are each independently a methyl group or a vinyl group, and at least one is a vinyl group.

Furthermore, as the vinyl group-containing straight-chain organopolysiloxane (A1), a vinyl group-containing straight-chain organopolysiloxane containing a first vinyl group-containing straight-chain organopolysiloxane (A1-1) having a vinyl group content being two or more vinyl groups in the molecule and equal to or less than 0.4 mol % and a vinyl group-containing straight-chain organopolysiloxane containing a second vinyl group-containing straight-chain organopolysiloxane (A1-2) having a vinyl group content being 0.5 to 15 mol % is preferred. When the first vinyl group-containing straight-chain organopolysiloxane (A1-1) having an ordinary vinyl group content and the second vinyl group-containing straight-chain organopolysiloxane (A1-2) having a high vinyl group content are combined together as raw rubber which is a raw material of the silicone rubber, it is possible to unevenly distribute vinyl groups and more effectively form an uneven crosslink density in the crosslink network of the silicone rubber. As a result, it is possible to more effectively increase the tear strength of the silicone rubber.

Specifically, as the vinyl group-containing straight-chain organopolysiloxane (A1), for example, the first vinyl group-containing straight-chain organopolysiloxane (A1-1) including two or more a unit in which, in Formula (1-1), $R^1$ is a vinyl group and/or a unit in which $R^2$ is a vinyl group in the molecule and includes equal to or less than 0.4 mol % thereof and the second vinyl group-containing straight-chain organopolysiloxane (A1-2) including 0.5 to 15 mol % of the unit in which $R^2$ is a vinyl group and/or the unit in which $R^2$ is a vinyl group are preferably used.

In addition, the vinyl group content of the first vinyl group-containing straight-chain organopolysiloxane (A1-1) is preferably 0.01 to 0.2 mol % and more preferably 0.02 to 0.15 mol %. In addition, the vinyl group content of the second vinyl group-containing straight-chain organopolysiloxane (A1-2) is preferably 0.5 to 12 mol % and more preferably 0.8 to 8 mol %.

Furthermore, in the case of blending the first vinyl group-containing straight-chain organopolysiloxane (A1-1) and the second vinyl group-containing straight-chain organopolysiloxane (A1-2) in combination, the mass ratio between (A1-1) and (A1-2) is not particularly limited, but (A1-1):(A1-2) is, for example, preferably 50:50 to 95:5, more preferably 60:40 to 92:8, and still more preferably 80:20 to 90:10 in terms of the weight ratio.

For each of the first and second vinyl group-containing straight-chain organopolysiloxane (A1-1) and (A1-2), only one kind of organopolysiloxane may be used or two or more kinds of organopolysiloxane may be used in combination.

In addition, the vinyl group-containing organopolysiloxane (A) may include a vinyl group-containing branched organopolysiloxane (A2) having a branched structure.

«Organohydrogen Polysiloxane (B)»

The silicone rubber-based curable composition of the present embodiment is capable of including an organohydrogen polysiloxane (B).

The organohydrogen polysiloxane (B) is divided into a straight-chain organohydrogen polysiloxane (B1) having a straight-chain structure and a branched organohydrogen polysiloxane (B2) having a branched structure, and the silicone rubber-based curable composition is capable of including any one or both of these organohydrogen polysiloxanes.

The straight-chain organohydrogen polysiloxane (B1) is a polymer that has a straight-chain structure, has a structure in which hydrogen directly bonds to Si (Si—H), causes a hydrosilylation reaction with a vinyl group that a component blended into the silicone rubber-based curable composition has, which is not the vinyl group of the vinyl group-containing organopolysiloxane (A), and crosslinks these components.

The molecular weight of the straight-chain organohydrogen polysiloxane (B1) is not particularly limited; however, for example, the weight-average molecular weight is preferably equal to or less than 20,000 and more preferably equal to or more than 1,000 and equal to or less than 10,000.

The weight-average molecular weight of the straight-chain organohydrogen polysiloxane (B1) can be measured by, for example, polystyrene conversion in gel permeation chromatography (GPC) in which chloroform is used as a developing solvent.

In addition, the straight-chain organohydrogen polysiloxane (B1) is, generally, preferably an organohydrogen polysiloxane having no vinyl group. In such a case, it is possible to accurately prevent the progress of a crosslinking reaction in the molecule of the straight-chain organohydrogen polysiloxane (B1).

As the above-described straight-chain organohydrogen polysiloxane (B1), for example, an organohydrogen polysiloxane having a structure represented by Formula (2) is preferably used.

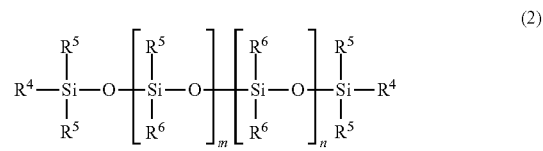

(2)

In Formula (2), $R^4$ is a substituted or unsubstituted alkyl group, alkenyl group, or aryl group having 1 to 10 carbon atoms, a hydrocarbon group formed by combining the above-described groups, or a hydride group. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, a butenyl group, and the like are exemplified. As the aryl group having 1 to 10 carbon atoms, for example, a phenyl group is exemplified.

In addition, $R^5$ is a substituted or unsubstituted alkyl group, alkenyl group, or aryl group having 1 to 10 carbon atoms, a hydrocarbon group formed by combining the above-described groups, or a hydride group. As the alkyl group having 1 to 10 carbon atoms, for example, a methyl group, an ethyl group, and a propyl group are exemplified, and, among these, a methyl group is preferred. As the alkenyl group having 1 to 10 carbon atoms, for example, a vinyl group, an allyl group, a butenyl group, and the like are exemplified. As the aryl group having 1 to 10 carbon atoms, for example, a phenyl group is exemplified.

In Formula (2), a plurality of $R^4$'s is groups independent from each other and may be different from or identical to each other. Furthermore, this is also true for $R^5$. However, among the plurality of $R^4$ and $R^5$, at least two are a hydride group.

In addition, $R^6$ is a substituted or unsubstituted alkyl group or aryl group having 1 to 8 carbon atoms or a hydrocarbon group formed by combining the above-described groups. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group and the like are exemplified. A plurality of $R^6$'s is groups independent from each other and may be different from or identical to each other.

As a substituent in $R^4$, $R^5$, and $R^6$ in Formula (2), for example, a methyl group, a vinyl group, and the like are exemplified, and a methyl group is preferred from the viewpoint of preventing a crosslinking reaction in the molecule.

Furthermore, m and n are the numbers of repeating units configuring the straight-chain organohydrogen polysiloxane (B1) represented by Formula (2), m is an integer of 2 to 150, and n is an integer of 2 to 150. Preferably, m is an integer of 2 to 100, and n is an integer of 2 to 100.

Only one kind of straight-chain organohydrogen polysiloxane (B1) may be used or two or more kinds of organopolysiloxane may be used in combination.

The branched organohydrogen polysiloxane (B2) has a branched structure and is thus a component that forms a region having a high crosslink density and significantly contributes to the formation of a structure with an uneven crosslink density in a silicone rubber system. In addition, similar to the straight-chain organohydrogen polysiloxane (B1), the branched organohydrogen polysiloxane is a polymer that has a structure in which hydrogen directly bonds to Si (≡Si—H), causes a hydrosilylation reaction with a vinyl group of a component blended into the silicone rubber-based curable composition, which is not the vinyl group of the vinyl group-containing organopolysiloxane (A), and crosslinks these components.

In addition, the specific gravity of the branched organohydrogen polysiloxane (B2) is in a range of 0.9 to 0.95.

Furthermore, the branched organohydrogen polysiloxane (B2) is, generally, preferably an organohydrogen polysiloxane having no vinyl group. In such a case, it is possible to accurately prevent the progress of a crosslinking reaction in the molecule of the branched organohydrogen polysiloxane (B2).

In addition, as the branched organohydrogen polysiloxane (B2), an organohydrogen polysiloxane represented by Average Composition Formula (c) is preferred.

Average Composition Formula (c)

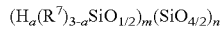

$(H_a(R^7)_{3-a}SiO_{1/2})_m(SiO_{4/2})_n$ (In Formula (c), $R^7$ is a monovalent organic group, a is an integer in a range of 1 to 3, m is the number of $H_a(R^7)_{3-a}SiO_{1/2}$ units, and n is the number of $SiO_{4/2}$ units.)

In Formula (c), $R^7$ is a monovalent organic group and preferably a substituted or unsubstituted alkyl group or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the aryl group having 1 to 10 carbon atoms, for example, a phenyl group is exemplified.

In Formula (c), a is the number of hydride groups (hydrogen atoms directly bonding to Si), an integer in a range of 1 to 3, and preferably 1.

In addition, in Formula (c), m is the number of the $H_a(R^7)_{3-a}SiO_{1/2}$ units, and n is the number of the $SiO_{4/2}$ units.

The branched organohydrogen polysiloxane (B2) has a branched structure. The straight-chain organohydrogen polysiloxane (B1) and the branched organohydrogen polysiloxane (B2) are different from each other in terms of the fact that the structure thereof is a straight-chain structure or a branched structure, and the number of alkyl groups R bonding to Si when the number of Si's is set to 1 (R/Si) is 1.8 to 2.1 in the straight-chain organohydrogen polysiloxane (B1) and is in a range of 0.8 to 1.7 in the branched organohydrogen polysiloxane (B2).

The branched organohydrogen polysiloxane (B2) has a branched structure, and thus the amount of the residue at the time of heating the branched organohydrogen polysiloxane up to 1,000° C. in a nitrogen atmosphere at a temperature-rise rate of 10° C./minute reaches equal to or more than 5%. In contrast, the straight-chain organohydrogen polysiloxane (B1) has a straight-chain shape, and thus the amount of the residue after heating the straight-chain organohydrogen polysiloxane under the above-described conditions reaches almost zero.

In addition, as specific examples of the branched organohydrogen polysiloxane (B2), an organohydrogen polysiloxane having a structure represented by Formula (3) is exemplified.

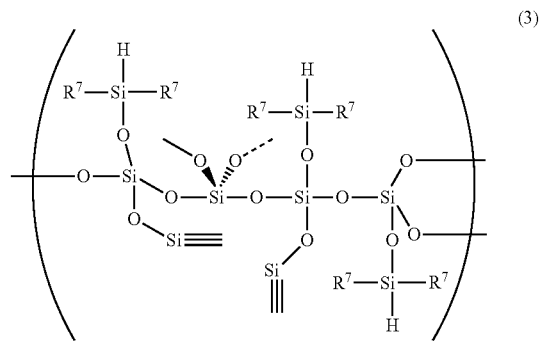

In Formula (3), $R^7$ is a substituted or unsubstituted alkyl group or aryl group having 1 to 8 carbon atoms, a hydrocarbon group formed by combining the above-described groups, or a hydrogen atom. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group and the like are exemplified. As a substituent in $R^7$, for example, a methyl group and the like are exemplified.

In Formula (3), a plurality of $R^7$'s is groups independent from each other and may be different from or identical to each other.

In addition, in Formula (3), "—O—Si≡" indicates that Si has a three-dimensionally broadening branched structure.

Only one kind of branched organohydrogen polysiloxane (B2) may be used or two or more kinds of organopolysiloxane may be used in combination.

In addition, in the straight-chain organohydrogen polysiloxane (B1) and the branched organohydrogen polysiloxane (B2), the amounts of the hydrogen atom (hydride group) directly bonding to Si are not particularly limited respectively. However, in the silicone rubber-based curable composition, the amount of the total hydride groups in the straight-chain organohydrogen polysiloxane (B1) and the branched organohydrogen polysiloxane (B2) is preferably 0.5 to 5 mol and more preferably 1 to 3.5 mol with respect to 1 mol of the vinyl group in the vinyl group-containing straight-chain organopolysiloxane (A1). In such a case, it is possible to reliably form a crosslink network between the straight-chain organohydrogen polysiloxane (B1) and the branched organohydrogen polysiloxane (B2), and the vinyl group-containing straight-chain organopolysiloxane (A1).

In the present embodiment, the content of the elastomer composition in the conductive paste is preferably equal to or more than 1% by mass, more preferably equal to or more than 3% by mass, and still more preferably equal to or more than 5% by mass with respect to all of the conductive paste. In addition, the content of the elastomer composition in the conductive paste is preferably equal to or less than 25% by mass, more preferably equal to or less than 20% by mass, and still more preferably equal to or less than 15% by mass with respect to all of the conductive paste.

When the content of the elastomer composition is set to equal to or more than the above-described lower limit value, a conductive resin film formed using the conductive paste is capable of having appropriate flexibility. In addition, when the content of the elastomer composition is set to equal to or less than the above-described upper limit value, it is possible to improve the mechanical strength of the conductive resin film.

«Silica Particles (C)»

The silicone rubber-based curable composition of the present embodiment is capable of including silica particles (C). In such a case, it is possible to improve the hardness or mechanical strength of a conductive resin film to be formed of the conductive paste.

The silica particles (C) are not particularly limited, and, for example, fumed silica, pyrogenic silica, precipitated silica, and the like are used. These may be used singly or two or more kinds thereof may be used in combination.

The specific surface area of the silica particles (C) by, for example, a BET method is, for example, preferably 50 to 400 m²/g and more preferably 100 to 400 m²/g. In addition, the average primary particle diameter of the silica particles (C) is, for example, preferably 1 to 100 nm and more preferably approximately 5 to 20 nm.

When silica particles having a specific surface area and an average particle diameter in the above-described ranges are used as the silica particles (C), it is possible to improve the hardness or mechanical strength, particularly, tensile strength of silicone rubber to be formed.

In the present embodiment, the content of the silica particles (C) in the conductive paste is preferably equal to or more than 1% by mass, more preferably equal to or more than 2% by mass, and still more preferably equal to or more than 3% by mass with respect to the entire conductive paste. In addition, the content of the silica particles (C) in the conductive paste is preferably equal to or less than 15% by mass, more preferably equal to or less than 12% by mass, and still more preferably equal to or less than 10% by mass with respect to the entire conductive paste.

When the content of the silica particles (C) is set to equal to or more than the above-described lower limit value, a conductive resin film formed using the conductive paste is capable of having an appropriate mechanical strength. In addition, when the content of the silica particles (C) is set to equal to or less than the above-described upper limit value, the conductive resin film is capable of having an appropriate conductive characteristic.

«Silane Coupling Agent (D)»

The silicone rubber-based curable composition of the present embodiment is capable of including a silane coupling agent (D).

The silane coupling agent (D) is capable of having a hydrolysable group. The hydrolysable group is hydrolyzed by water and turns into a hydroxyl group, and this hydroxyl group causes a dehydration condensation reaction with a hydroxyl group on the surfaces of the silica particles (C), whereby it is possible to modify the surfaces of the silica particles (C).

In addition, this silane coupling agent (D) is capable of including a silane coupling agent having a hydrophobic group. In such a case, this hydrophobic group is imparted to the surfaces of the silica particles (C), and thus, in the silicone rubber-based curable composition, furthermore, in silicone rubber, the cohesive force of the silica particles (C) weakens (cohesion by a hydrogen bond attributed to a silanol group decreases), and, as a result, it is assumed that the dispersibility of the silica particles in the silicone rubber-based curable composition improves. Therefore, the number of interfaces between the silica particles and a rubber matrix increases, and the stiffening effect of the silica particles increases. Furthermore, it is assumed that, at the time of the matrix deformation of rubber, the sliding property of the silica particles in the matrix improves. In addition, due to the improvement of the dispersibility and the improvement of the sliding property of the silica particles (C), the mechanical strength (for example, tensile strength, tear strength, or the like) of the silicone rubber by the silica particles (C) improves.

Furthermore, the silane coupling agent (D) is capable of including a silane coupling agent having a vinyl group. In such a case, the vinyl group is introduced to the surfaces of the silica particles (C). Therefore, at the time of the curing of the silicone rubber-based curable composition, that is, when the vinyl group that the vinyl group-containing organopolysiloxane (A) has and the hydride group that the organohydrogen polysiloxane (B) has cause a hydrosilylation reaction, and a network (crosslink structure) is formed thereby, the vinyl group that the silica particles (C) have also gets involved with a hydrosilylation reaction with the hydride group that the organohydrogen polysiloxane (B) has, and thus the silica particles (C) are also incorporated into the network. Therefore, it is possible to attain a decrease in the hardness and an increase in the modulus of silicone rubber to be formed.

As the silane coupling agent (D), it is possible to jointly use a silane coupling agent having a hydrophobic group and a silane coupling agent having a vinyl group.

As the silane coupling agent (D), for example, a silane coupling agent represented by Formula (4) is exemplified.

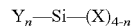

$$Y_n\text{—Si—}(X)_{4-n} \qquad (4)$$

In Formula (4), n represents an integer of 1 to 3. Y represents any functional group of functional groups having a hydrophobic group, a hydrophilic group, or a vinyl group, is a hydrophobic group when n is 1, and, when n is 2 or 3, at least one of Y's is a hydrophobic group. X represents a hydrolysable group.

The hydrophobic group is an alkyl group or aryl group having 1 to 6 carbon atoms or a hydrocarbon group formed by combining the above-described groups, for example, a methyl group, an ethyl group, a propyl group, a phenyl group, and the like are exemplified, and, among these, particularly, a methyl group is preferred.

In addition, as the hydrophilic group, for example, a hydroxyl group, a sulfonic acid group, a carboxyl group, a carbonyl group, and the like is exemplified, and, among these, a hydroxyl group is preferred. The hydrophilic group may be included as a functional group, but is preferably not included from the viewpoint of imparting hydrophobicity to the silane coupling agent (D).

Furthermore, as the hydrolysable group, an alkoxy group such as a methoxy group or an ethoxy group, a chloro group, a silazane group, and the like are exemplified, and, among these, a silazane group is preferred due to its high reactivity with the silica particles (C). A silane coupling agent having a silazane group as the hydrolysable group have two ($Y_n$—Si—) structures in Formula (4) due to its structural characteristic.

Regarding the specific examples of the silane coupling agent (D) represented by Formula (4), for example, as a silane coupling agent having a hydrophobic group as the functional group, alkoxysilanes such as methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, and decyltrimethoxysilane; chlorosilanes such as methyltrichlorosilane, dimethyldichlorosilane, trimethylchlorosilane, and phenyltrichlorosilane; and hexamethyldisilazane are exemplified, as a silane coupling agent having a vinyl group as the functional group, alkoxysilanes such as methacryloxypropyltriethoxysilane, methacryloxypropyltrimethoxysilane, methacryloxypropylmethyldiethoxysilane, methacryloxypropylmethyldimethoxysilane, vinyltriethoxysilane, vinyltrimethoxysilane, and vinylmethyldimethoxysilane; chlorosilanes such as vinyltrichlorosilane and vinylmethyldichlorosilane; and divinyltetramethyldisilazane are exemplified, and, among these, when the above description is taken into account, particularly, hexamethyldisilazane is preferred as a silane coupling agent having a hydrophobic group, and divinyltetramethyldisilazane is preferred as a silane coupling agent having a vinyl group.

In the present embodiment, the lower limit value of the content of the silane coupling agent (D) is preferably equal to or more than 1% by mass, more preferably equal to or more than 3% by mass, and still more preferably equal to or more than 5% by mass with respect to 100 parts by weight of the total amount of the vinyl group-containing organopolysiloxane (A). In addition, the upper limit value of the content of the silane coupling agent (D) is preferably equal to or less than 100% by mass, more preferably equal to or less than 80% by mass, and still more preferably equal to or less than 40% by mass with respect to 100 parts by weight of the total amount of the vinyl group-containing organopolysiloxane (A).

When the content of the silane coupling agent (D) is set to equal to or more than the lower limit value, a conductive resin film formed using the conductive paste has appropriate adhesiveness to a substrate, and it is possible to contribute to the improvement of the mechanical strength as a wire and an entire substrate in the case of using the silica particles (C). In addition, when the content of the silane coupling agent (D) is set to equal to or less than the upper limit value, the conductive resin film is capable of having an appropriate mechanical characteristic.

«Platinum or Platinum Compound (E)»

The silicone rubber-based curable composition of the present embodiment is capable of including platinum or a platinum compound (E).

The platinum or platinum compound (E) is a catalytic component that acts as a catalyst at the time of curing. The amount of the platinum or platinum compound (E) added is the amount of a catalyst.

As the platinum or platinum compound (E), well-known platinum or platinum compound can be used, and, for example, platinum black, platinum supported by silica, carbon black, or the like, chloroplatinic acid or an alcohol solution of chloroplatinic acid, a complex salt of chloroplatinic acid and an olefin, a complex salt of chloroplatinic acid and vinylsiloxane, and the like are exemplified.

Only one kind of platinum or platinum compound (E) may be used or two or more kinds of platinum or platinum compounds may be used in combination.

In the present embodiment, the content of the platinum or platinum compound (E) in the silicone rubber-based curable composition means the amount of a catalyst, can be appropriately set, and, specifically, is an amount at which the weight of platinum group metal reaches 0.01 to 1,000 ppm and preferably reaches 0.1 to 500 ppm with respect to 100 parts by weight of the total amount of the vinyl group-containing organopolysiloxane (A), the silica particles (C), and the silane coupling agent (D).

When the content of the platinum or platinum compound (E) is set to equal to or more than the lower limit value, it becomes possible for the silicone rubber-based curable composition to cure at an appropriate speed. In addition, when the content of the platinum or platinum compound (E) is set to equal to or less than the upper limit value, it is possible to contribute to the reduction of manufacturing costs.

When the content of the platinum or platinum compound (E) is set to equal to or more than the lower limit value, it becomes possible for the silicone rubber-based curable composition in the conductive paste to cure at an appropriate speed. In addition, when the content of the platinum or platinum compound (E) is set to equal to or less than the upper limit value, it is possible to contribute to the reduction of the cost for the production of the conductive paste.

«Water (F)»

In addition, the silicone rubber-based curable composition of the present embodiment may include, in addition to the components (A) to (E), water (F).

The water (F) is a component that functions as a dispersion medium that disperses the respective components included in the silicone rubber-based curable composition and contributes to the reaction between the silica particles (C) and the silane coupling agent (D). Therefore, it is possible to more reliably link the silica particles (C) and the silane coupling agent (D) in the silicone rubber and exhibit uniform characteristics as a whole.

Furthermore, in a case where the water (F) is contained, the content thereof can be appropriately set and is, specifically, for example, preferably in a range of 10 to 100 parts by weight and more preferably in a range of 30 to 70 parts by weight with respect to 100 parts by weight of the silane coupling agent (D). Therefore, it is possible to cause the reaction between the silane coupling agent (D) and the silica particles (C) to progress more reliably.

(Other Components)

Furthermore, the silicone rubber-based curable composition of the present embodiment is capable of further including additional components other than the components (A) to (F). As the additional components, for example, additives such as an inorganic filler other than the silica particles (C) such as diatomaceous earth, iron oxide, zinc oxide, titanium oxide, barium oxide, magnesium oxide, cerium oxide, calcium carbonate, magnesium carbonate, zinc carbonate, glass wool, or mica, a reaction inhibitor, a dispersant, a pigment, a dye, an antistatic agent, an antioxidant, a flame retardants, and a thermal conductivity improver are exemplified.

(Conductive Filler)

The conductive paste of the present embodiment includes a conductive filler. As this conductive filler, a well-known conductive material maybe used, but the conductive filler is capable of including a metallic powder (G) described below. These may be used singly or two or more kinds thereof may be used in combination.

According to the present inventors' knowledge, it has been clarified that, when a scale-like metallic powder having a predetermined characteristic is used for the conductive paste containing the conductive filler, it is possible to improve conduction stability in a conductive resin film obtained from the conductive paste, and, when the tap density and average particle diameter $D_{50}$ of the scale-like metallic powder are used as indexes, the conduction stability is stably evaluated.

As a result of intensive studies based on the above-described knowledge, it was found that, when a scale-like metallic powder having indexes (the tap density and the average particle diameter $D_{50}$) in appropriate ranges is employed, it is possible to improve conduction stability in a conductive resin film such as a wire for which the conductive paste is used.

As the conductive filler, it is possible to use the scale-like metallic powder (G) satisfying a condition A of the tap density being equal to or more than 2.80 g/cm$^3$ and equal to or less than 4.50 g/cm$^3$ and the average particle diameter $D_{50}$ being equal to or more than 2.30 μm and equal to or less than 14.0 μm. In such a case, it is possible to improve conduction stability in a conductive resin film obtained from the conductive paste during repetitive stretching.

In addition, as the conductive filler, it is possible to use the scale-like metallic powder (G) satisfying a condition B of the specific surface area being equal to or more than 0.50 m$^2$/g and equal to or less than 2.00 m$^2$/g and the average particle diameter $D_{50}$ being equal to or more than 2.30 μm and equal to or less than 10.0 μm. In such a case, it is possible to realize a conductive resin film having excellent durability without degrading the conductive property during stretching or release from stretching after a repetitive stretching test.

In addition, the average particle diameter $D_{50}$ of the metallic powder (G) is, for example, equal to or more than 2.30 m and equal to or less than 14.0 μm, more preferably equal to or more than 2.30 μm and equal to or less than 10.0 μm, and still more preferably equal to or more than 3.00 μm and equal to or less than 9.40 μm.

As the average particle diameter $D_{50}$ of the metallic powder (G), the 50% particle diameter measured using a laser diffraction particle size measurement instrument is used. The average particle diameter is a particle diameter at a point at which the particle diameter cumulated from the small particle diameter reaches 50% by mass in a volume-based particle size distribution.

In addition, the tap density of the scale-like metallic powder (G) is, for example, equal to or more than 2.80 g/cm$^3$ and equal to or less than 4.50 g/cm$^3$, preferably equal to or more than 3.20 g/cm$^3$ and equal to or less than 4.05 g/cm$^3$, and more preferably equal to or more than 3.30 g/cm$^3$ and equal to or less than 4.00 g/cm$^3$.

The tap density of the scale-like metallic powder (G) is measured according to "Metallic powders-Determination of tap density", ISO 3953-1985(E).

In addition, the specific surface area of the metallic powder (G) is, for example, equal to or more than 0.50 m$^2$/g and equal to or less than 2.00 m$^2$/g, preferably equal to or more than 0.51 m$^2$/g and equal to or less than 1.80 m$^2$/g, and more preferably equal to or more than 0.52 m$^2$/g and equal to or less than 1.60 m$^2$/g.

As the specific surface area of the scale-like metallic powder (G), a BET specific surface area measured using an automatic specific surface area measurement instrument is used.

As the metallic powder (G), a metallic powder other than the scale-like metallic powder (G) may be contained. The shape of the other metallic powder (G) is not limited, and a metallic powder having a dendrite shape, a spherical shape, or the like which has been used in the related art can be used.

Metal configuring the metallic powder (G) is not particularly limited, and the metallic powder is capable of including, for example, at least one kind among copper, silver, gold, nickel, tin, lead, zinc, bismuth, antimony, or a metallic powder formed by alloying the above-described metals or two or more kinds thereof.

Among them, the metallic powder (G) preferably includes silver or copper, that is, silver powder or copper powder due to its favorable conductive property or favorable easiness in procurement.

As the metallic powder (G), a metallic powder coated with a different kind of metal also can be used.

In the present embodiment, the content of the conductive filler in the conductive paste is preferably equal to or more than 30% by mass, more preferably equal to or more than 40% by mass, and still more preferably equal to or more than 50% by mass with respect to all of the conductive paste. In addition, the content of the conductive filler in the conductive paste is preferably equal to or less than 85% by mass, more preferably equal to or less than 75% by mass, and still more preferably equal to or less than 65% by mass with respect to all of the conductive paste.

In addition, the lower limit value of the content of the conductive filler that the conductive resin film obtained from the conductive paste includes is preferably equal to or more than 30% by mass, more preferably equal to or more than 40% by mass, and still more preferably equal to or more than 50% by mass with respect to the entire conductive resin film. In addition, the upper limit value of the content of the conductive filler that the conductive resin film includes is equal to or less than 95% by mass, preferably equal to or less than 90% by mass, more preferably equal to or less than 87% by mass, and still more preferably equal to or less than 85% by mass with respect to the entire conductive resin film.

When the content of the conductive filler is set to equal to or more than the lower limit value, a conductive resin film obtained from the conductive paste is capable of having an appropriate conductive characteristic. In addition, when the content of the conductive filler is set to equal to or less than the upper limit value, the conductive resin film is capable of having appropriate flexibility.

In addition, the lower limit value of the content of the silica particles (C) that the conductive resin film obtained from the conductive paste includes can be set to, for example, equal to or more than 1% by mass, preferably equal to or more than 3% by mass, and more preferably equal to or more than 5% by mass with respect to 100% by mass of the total amount of the silica particles (C) and the conductive filler. Therefore, it is possible to improve the mechanical strength of the conductive resin film. On the other hand, the upper limit value of the content of the silica particles (C) that the conductive resin film includes can be set to, for example, equal to or less than 20% by mass, preferably equal to or less than 15% by mass, and more preferably equal to or less than 10% by mass with respect to 100% by mass of the total amount of the silica particles (C) and the conductive filler. Therefore, it is possible to achieve the balance between the stretch electric characteristic and the mechanical strength in the conductive resin film.

«Organic Peroxide (H)»

The silicone rubber-based curable composition of the present embodiment is capable of including an organic peroxide (H). The organic peroxide (H) is a component that acts as a catalyst. The organic peroxide (H) can be used in place of the organohydrogen polysiloxane (B) and the platinum or platinum compound (E), or it is possible to jointly use the organohydrogen polysiloxane (B), the platinum or platinum compound (E), and the organic peroxide (H).

As the organic peroxide (H), for example, ketone peroxides, diacyl peroxides, hydroperoxides, dialkyl peroxides, peroxyketals, alkyl peresters, peroxyesters and peroxydioxides are exemplified, and, specifically, for example, benzoyl peroxide, 2,4-dichlorobenzoyl peroxide, p-methylbenzoyl peroxide, o-methylbenzoyl peroxide, dicumyl peroxide, 2,5-dimethyl-bis(2,5-t-butylperoxy)hexane, di-t-butylperoxide, t-butylperbenzoate, 1,6-hexanediol-bis-t-butylperoxycarbonate, and the like are exemplified.

(Solvent)

The conductive paste of the present embodiment includes a solvent. As this solvent, a variety of well-known solvents can be used, and, for example, a high-boiling point solvent can be included. The solvent may be used singly or two or more kinds of solvents may be used in combination.

The lower limit value of the boiling point of the high-boiling point solvent is, for example, equal to or higher than 100° C., preferably equal to or higher than 130° C., and more preferably equal to or higher than 150° C. In such a case, it is possible to improve the printing stability of screen printing or the like. On the other hand, the upper limit value of the boiling point of the high-boiling point solvent is not particularly limited and may be, for example, equal to or lower than 300° C., equal to or lower than 290° C., or equal to or lower than 280° C. In such a case, an excessive heat history at the time of forming a wire can be suppressed, and thus it is possible to favorably maintain damage to a base substrate or the shape of a wire formed of the conductive paste.

In addition, the solvent of the present embodiment can be appropriately selected from the viewpoint of the solubility and boiling point of the elastomer composition, and, an aliphatic hydrocarbon having 5 to 20 carbon atoms, preferably, an aliphatic hydrocarbon having 8 to 18 carbon atoms, and more preferably an aliphatic hydrocarbon having 10 to 15 carbon atoms can be included.

In addition, as examples of the solvent of the present embodiment, for example, aliphatic hydrocarbons such as pentane, hexane, cyclohexane, heptane, methylcyclohexane, ethylcyclohexane, octane, decane, dodecane, and tetradecane; aromatic hydrocarbons such as benzene, toluene, ethylbenzene, xylene, mesitylene, trifluoromethylbenzene, and benzotrifluoride; ethers such as diethyl ether, diisopropyl ether, dibutyl ether, cyclopentyl methyl ether, cyclopentyl ethyl ether, ethylene glycol dimethyl ether, ethylene glycol diethyl ether, diethylene glycol dimethyl ether, diethylene glycol monobutyl ether, dipropylene glycol dimethyl ether, dipropylene glycol methyl-n-propyl ether, 1,4-dioxane, 1,3-dioxane, and tetrahydrofuran; haloalkanes such as dichloromethane, chloroform, 1,1-dichloroethane, 1,2-dichloroethane, 1,1,1-trichloroethane, and 1,1,2-trichloroethane; carboxylic acid amides such as N, N-dimethylformamide and N, N-dimethylacetamide; sulfoxides such as dimethyl sulfoxide and diethyl sulfoxide; and esters such as diethyl carbonate can be exemplified. These solvents may be used singly or two or more kinds of solvents may be used in combination.

The solvent used here needs to be appropriately selected from solvents capable of uniformly dissolving or dispersing the composition components in the conductive paste.

The solvent is capable of including a first solvent in which the upper limit value of the solvent has an upper limit of the polarity term ($\delta_p$) of a Hansen solubility parameter is, for example, equal to or less than 10 MPa$^{1/2}$, preferably equal to or less than 7 MPa$^{1/2}$, and more preferably equal to or less than 5.5 MPa$^{1/2}$. In such a case, it is possible to improve the dispersibility and solubility of the elastomer composition such as the silicone rubber-based curable resin composition in the conductive paste. The lower limit value of the polarity term ($\delta_p$) of the first solvent is not particularly limited and may be, for example, equal to or more than 0 Pa$^{1/2}$.

The upper limit value of the hydrogen bond term ($\delta_h$) of the Hansen solubility parameter in the first solvent is, for example, equal to or less than 20 MPa$^{1/2}$, preferably equal to or less than 10 MPa$^{1/2}$, and more preferably equal to or less than 7 MPa$^{1/2}$. In such a case, it possible to improve the dispersibility and solubility of the elastomer composition such as the silicone rubber-based curable resin composition in the conductive paste. The lower limit value of the hydrogen bond term ($\delta_h$) of the first solvent is not particularly limited and may be, for example, equal to or more than 0 Pa$^{1/2}$.

The Hansen solubility parameter (HSP) is an index representing solubility, indicating how much a certain substance dissolves in another substance. HSP represents solubility as a three-dimensional vector. This three-dimensional vector can be typically represented by a dispersion term ($\delta_d$), a polarity term ($\delta_p$), and a hydrogen bond term ($\delta_h$). In addition, HSP's having similar vectors can be determined to have high solubility. The similarity between vectors can be determined by the distance of the Hansen solubility parameter (HSP distance).

The Hansen solubility parameter (HSP value) used in the present specification can be computed using software called HSPiP (Hansen Solubility Parameters in Practice). Here, the computer software HSPiP developed by Hansen and Abbott includes a function of computing the HSP distance and a database of Hansen parameters of a variety of resins, solvents, and non-solvents.

The solubility of each resin in a pure solvent and a solvent mixture of a good solvent and a poor solvent is investigated, the results are input to the HSPiP software, and D: dispersion term, P: polarity term, H: hydrogen bond term, and R0: solubility sphere radius are computed.

As the solvent of the present embodiment, for example, a solvent having a small HSP distance and a small difference in the polarity term or the hydrogen bond term between an elastomer or a configuration unit configuring the elastomer and the solvent can be selected.

The lower limit value of the viscosity of the conductive paste measured at a room temperature (25° C.) and a shear rate of 20 [1/s] is, for example, equal to or more than 1 Pa·s, preferably equal to or more than 5 Pa·s, and more preferably equal to or more than 10 Pa·s. In such a case, it is possible to improve the film-forming property. In addition, it is also possible to enhance the shape-retaining property at the time of forming a thick film. On the other hand, the upper limit value of the viscosity of the conductive paste at a room temperature (25° C.) is, for example, equal to or less than 100 Pa·s, preferably equal to or less than 90 Pa·s, and more preferably equal to or less than 80 Pa·s. In such a case, it is possible to improve printability in the conductive paste.

In the conductive paste in the present embodiment, the viscosity measured at a room temperature (25° C.) and a shear rate of 1 [1/s] is represented by η1, the viscosity measured at a room temperature (25° C.) and a shear rate of 5 [1/s] is represented by η5, and the viscosity ratio (η1/η5) is regarded as the thixotropy index. At this time, the lower limit value of the thixotropy index is, for example, equal to or more than 1.0, preferably equal to or more than 1.1, and more preferably equal to or more than 1.2. In such a case, it is possible to stably retain the shape of a wire obtained by a printing method. On the other hand, the upper limit value of the thixotropy index is, for example, equal to or less than 3.0, preferably equal to or less than 2.5, and more preferably equal to or less than 2.0. In such a case, it is possible to improve the easiness in printing of the conductive paste.

In the present embodiment, the viscosity and the thixotropy index can be controlled by, for example, appropriately selecting the kinds and amount blended of the respective components included in the conductive paste, the preparation method of the conductive paste, and the like. Among these, for example, the appropriate selection of the kind of the solvent such as a hydrophobic solvent, a hydrocarbon-based solvent, a high-boiling point solvent suitable for printing, or a solvent having a small polarity term or a small hydrogen bond term, the control of the uneven distribution of the crosslink density or crosslink structure of a resin by the amount of the silica particles (C) blended, the amount of the conductive filler blended, the blending ratio therebetween, and the use of the vinyl group-containing organopolysiloxane (A) having a vinyl group at the terminal, the surface modification of the silica particles (C) with the silane coupling agent (D), the reliable progress of the reaction between the silane coupling agent (D) and the silica particles (C) by the addition of water or the like, and the like are exemplified as elements for setting the viscosity and the thixotropy index in desired numerical ranges.

(Manufacturing method of conductive paste) Hereinafter, a manufacturing method of a conductive paste according to the present embodiment will be described.

The conductive paste of the present embodiment can be manufactured by, for example, carrying out steps as described below.

First, the respective components of the silicone rubber-based curable composition are uniformly mixed using an arbitrary kneading device, thereby preparing a silicone rubber-based curable composition.

[1] For example, predetermined amounts of the vinyl group-containing organopolysiloxane (A), the silica particles (C), and the silane coupling agent (D) are weighed and then kneaded using an arbitrary kneading device, thereby obtaining a kneaded substance containing the respective components (A), (C) and (D).

The kneaded substance is preferably obtained by kneading the vinyl group-containing organopolysiloxane (A) and the silane coupling agent (D) in advance and then kneading (mixing) the silica particles (C) therewith. In such a case, the dispersibility of the silica particles (C) in the vinyl group-containing organopolysiloxane (A) further improves.

In addition, at the time of obtaining this kneaded substance, the water (F) may be added to the kneaded substance of the respective components (A), (C), and (D) as necessary. Therefore, it is possible to cause the reaction between the silane coupling agent (D) and the silica particles (C) to progress more reliably.

Furthermore, the respective components (A), (C) and (D) is preferably kneaded by carrying out a first step of heating the components at a first temperature and a second step of heating the components at a second temperature. In such a case, it is possible to treat the surfaces of the silica particles (C) with the coupling agent (D) in the first step and reliably remove a by-product generated from the reaction between the silica particles (C) and the coupling agent (D) from the kneaded substance in the second step. After that, the component (A) may be added to and further kneaded with the obtained kneaded substance as necessary. Therefore, it is possible to improve the familiarity of the components of the kneaded substance.

The first temperature is, for example, preferably approximately 40° C. to 120° C. and, for example, more preferably approximately 60° C. to 90° C. The second temperature is, for example, preferably approximately 130° C. to 210° C. and, for example, more preferably approximately 160° C. to 180° C.

In addition, the atmosphere in the first step is preferably an inert atmosphere such as a nitrogen atmosphere, and the atmosphere in the second step is preferably a reduced-pressure atmosphere.

Furthermore, the time of the first step is, for example, preferably approximately 0.3 to 1.5 hours and more preferably approximately 0.5 to 1.2 hours. The time of the second step is, for example, preferably approximately 0.7 to 3.0 hours, and more preferably approximately 1.0 to 2.0 hours.

When the first step and the second step are carried out under the above-described conditions, it is possible to more significantly obtain the above-described effect.

[2] Next, predetermined amounts of the organohydrogen polysiloxane (B) and the platinum or platinum compound (E) are weighed, then, the respective components (B) and (E) are kneaded into the kneaded substance prepared in the step [1] using an arbitrary kneading device, thereby obtaining a silicone rubber-based curable composition (elastomer composition).

At the time of kneading the respective components (B) and (E), it is preferable to knead the kneaded substance prepared in the step [1] and the organohydrogen polysiloxane (B) and knead the kneaded substance prepared in the step [1] and the platinum or platinum compound (E) in advance and then knead the respective kneaded substances. In such a case, it is possible to reliably disperse the respective components (A) to (E) in the silicone rubber-based curable composition without allowing the progress of the reaction between the vinyl group-containing organopolysiloxane (A) and the organohydrogen polysiloxane (B).

The temperature at the time of kneading the respective components (B) and (E) is, as a roll set temperature, for example, preferably approximately 10° C. to 70° C. and more preferably approximately 25° C. to 30° C.

Furthermore, the kneading time is, for example, preferably approximately 5 minutes to 1 hour and more preferably approximately 10 minutes to 40 minutes.

In the step [1] and the step [2], when the temperature is set in the above-described range, it is possible to more accurately prevent or suppress the progress of the reaction between the vinyl group-containing organopolysiloxane (A) and the organohydrogen polysiloxane (B). In addition, in the step [1] and the step [2], when the kneading time is set in the above-described range, it is possible to more reliably disperse the respective components (A) to (E) in the silicone rubber-based curable composition.

The kneading device used in the respective steps [1] and [2] is not particularly limited, and, for example, a kneader, a twin-roll, a Banbury mixer (continuous kneader), a pressure kneader, or the like can be used.

In addition, in the present step [2], a reaction inhibitor such as 1-ethynylcyclohexanol may be added to the kneaded substance. In such a case, even when the temperature of the kneaded substance is set to a relatively high temperature, it is possible to more accurately prevent or suppress the progress of the reaction between the vinyl group-containing organopolysiloxane (A) and the organohydrogen polysiloxane (B).

In addition, in the present step [2], the organic peroxide (H) may be added in place of the organohydrogen polysiloxane (B) and the platinum or platinum compound (E) or together with the organohydrogen polysiloxane (B) and the platinum or platinum compound (E). Preferred conditions such as the temperature and the time at the time of kneading the organic peroxide (H) and a device to be used are the same as the conditions at the time of kneading the organohydrogenpolysiloxane (B) and the platinum or platinum compound (E).

[3] Next, the elastomer composition (silicone rubber-based curable composition) obtained in the step [2] is dissolved in a solvent, and the conductive filler is added thereto, whereby the conductive paste of the present embodiment can be obtained.

[Use]

Hereinafter, an example of the use of the conductive paste of the present embodiment will be described with reference to FIG. 1. FIG. 1 schematically shows an electronic device 100 including a relevant wire as a cross-sectional view.

The electronic device 100 is capable of including a wiring substrate 50 and an electronic component 60 as shown in FIG. 1. The wiring substrate 50 is configured by providing a wire 10 on a substrate 20. As the substrate 20, a stretchable insulating substrate can be used. The wire 10 can be made of a cured substance obtained by curing the conductive paste of the present embodiment. The electronic component 60 may be configured so as to be electrically connected to the wire 10 configuring such a stretchable wiring substrate (wiring substrate 50).

The conductive paste of the present embodiment is capable of maintaining the stretch electric characteristic when repeatedly stretched while increasing the mechanical strength of a cured substance to be obtained, and thus it is possible to realize the structure of the electronic device 100 having excellent connection reliability or durability.

The electronic device 100 of the present embodiment can be used as, for example, a wearable device and can be preferably used for devices that are repeatedly stretched in all directions.

In addition, the substrate 20 configuring the electronic device 100 of the present embodiment is generally made of a flexible material.

As this material, the same material as the above-described elastomer can be employed. Specifically, elastomers such as silicone rubber, urethane rubber, fluorine rubber, nitrile rubber, acrylic rubber, styrene rubber, chloroprene rubber, and ethylene propylene rubber can be used, and it is possible to appropriately select this material according to the use or the like. In addition, the substrate 20 may be made of a cured substance of the silicone rubber-based curable composition.

In addition, for the substrate 20, an elastomer made of the elastomer composition can be used. In addition, the substrate 20 may be produced using an insulating paste including an elastomer composition containing silica particles and a solvent. As the solvent, the above-described kinds of solvents that are the same as the above-described solvent can be used, and, among them, a solvent soluble in the conductive paste or a conductive sheet which is a cured substance of the conductive paste can be used. As a specific solvent for the insulating paste, for example, a high-boiling point solvent or a solvent having a polarity term ($\delta_p$) or hydrogen bond term ($\delta_h$) of HSP being equal to or less than the above-described upper limit value can be used.

In addition, the electronic component 60 may be appropriately selected from known components according to the use. Specifically, a semiconductor element, a resistor or a capacitor other than the semiconductor element, or the like can be exemplified. As the semiconductor element, for example, a transistor, a diode, an LED, a capacitor, and the like can be exemplified. In the electronic device 100 of the present embodiment, the electronic component 60 is electrically connected by the wire 10.

In addition, the electronic device 100 of the present embodiment may be provided with a cover material 30 as necessary. The provision of this cover material 30 can prevent the wiring 10 and the electronic component 60 from being damaged. The cover material 30 may be configured so as to cover the electronic component 60 or the wire 10 on the substrate 20.

In addition, the cover material 30 can be made of the same material as the substrate 20. Such a cover material 30 follows the stretching of the substrate 20 or the wire 10, and thus the electronic device 100 can be evenly stretched, and the cover material is capable of contributing to the expansion of the service life of the electronic device 100.

Next, an example of manufacturing steps of the electronic device 100 of the present embodiment will be described using FIGS. 2A to 2F.

FIGS. 2A to 2F are cross-sectional views schematically showing manufacturing steps of the electronic device 100 in the present embodiment.

Figure 2A:
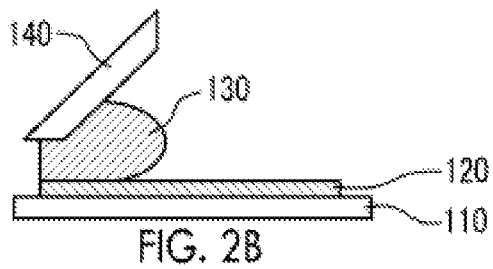
FIGS. 2A to 2F are cross-sectional views schematically showing manufacturing steps of the electronic device in the present embodiment.

First, as shown in FIG. 2A, a support 120 is installed on a work table 110, and an insulating paste 130 is applied onto the support 120. As an application method, a variety of methods can be used, and, for example, a printing method such as a squeegee method in which a squeegee 140 is used can be used. Subsequently, the coated film-like insulating paste 130 is dried, whereby an insulating layer 132 (dried insulating sheet) can be formed on the support 120. The drying conditions can be appropriately set according to the kind and amount of a solvent in the insulating paste 130, and, for example, it is possible to set the drying temperature to 150° C. to 180° C. and the drying time to 1 minute to 30 minutes.

Figure 2B:
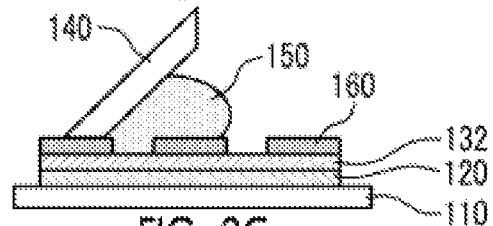
Figure 2C:
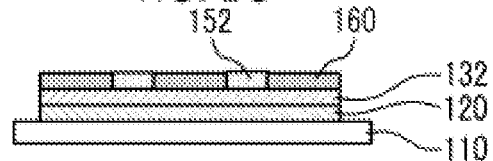
Figure 2D:
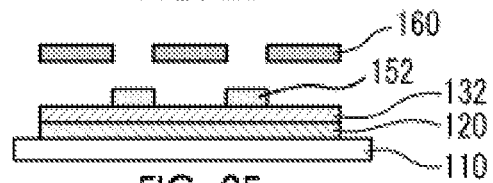

Subsequently, as shown in FIG. 2B, a mask 160 having a predetermined opening pattern is disposed on the insulating layer 132. In addition, as shown in FIGS. 2B and 2C, a conductive paste 150 is applied onto the insulating layer 132 through the mask 160. As an application method, the same method as the application method of the insulating paste 130 can be used, and, for example, squeegee printing using the squeegee 140 may also be used. Here, in a case where the insulating paste 130 and the conductive paste 150 each include a thermosetting elastomer composition, the pastes may be collectively cured after a conductive coated film (conductive layer 152) having a predetermined pattern shape is laminated on the dried insulating layer 132. A curing treatment can be appropriately set according to the thermosetting elastomer composition, and, for example, it is possible to set the curing temperature to 160° C. to 220° C. and the curing time to 1 hour to 3 hours. After the curing treatment or before the curing treatment, the mask 160 can be removed as shown in FIG. 2D. Therefore, it is possible to form a wire that is a cured substance of the conductive layer 152 having a predetermined shape on the substrate made of a cured substance of the insulating layer 132.

Figure 2E:
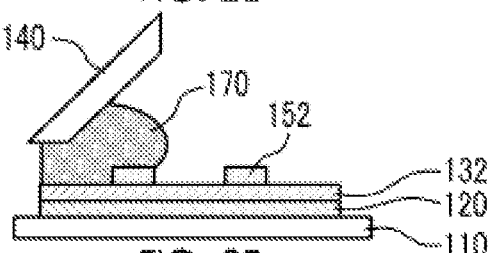
Figure 2F:
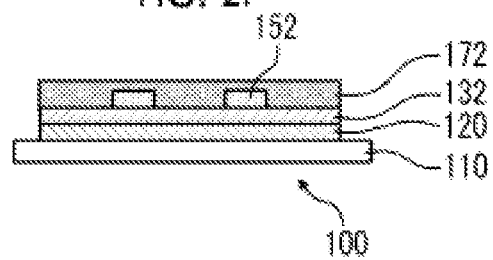

Subsequently, as shown in FIG. 2E, an insulating paste 170 is further applied onto the insulating layer 132 and the patterned conductive layer 152, and, as shown in FIG. 2F, an insulating layer 172 can be formed. These steps may be appropriately repeated. In addition, it is also possible to separate the support 120 from the insulating layer 132.

With the above-described steps, the electronic device 100 shown in FIG. 2F can be obtained.

In the case of using an insulating sheet in place of the insulating paste, the process may start from the step shown in FIG. 2B. That is, the conductive paste 150 may be applied to an insulating sheet through the mask 160 after the insulating sheet is installed on the support 120 and dried in a predetermined manner. The subsequent steps can be carried out according to the above-described steps. Therefore, the electronic device 100 shown in FIG. 2F can be obtained.

The present invention is not limited to the above-described embodiment, and modifications, improvements, and the like are included in the present invention as long as the object of the present invention can be achieved.

EXAMPLES

Hereinafter, the present invention will be described using examples and comparative examples, but the present invention is not limited thereto.

Materials used in the examples and the comparative examples are as described below.

(Vinyl Group-Containing Organopolysiloxane (A))

(A1-1): First vinyl group-containing straight-chain organopolysiloxane: The vinyl group content was 0.13 mol %, Mn was 227,734, Mw was 573,903, the IV value (dl/g) was 0.89), and a vinyl group-containing dimethylpolysiloxane synthesized according to the following synthesis scheme 1 (structure represented by Formula (1-1))

(A1-2): Second vinyl group-containing straight-chain organopolysiloxane: The vinyl group content was 0.92 mol %, and a vinyl group-containing dimethylpolysiloxane synthesized according to the following synthesis scheme 2 (structure represented by Formula (1-1) in which $R^1$ and $R^2$ were a vinyl group)

(Organohydrogen Polysiloxane (B))

(B1): Organohydrogen polysiloxane: manufactured by Momentive, "88466"

(Silica Particles (C))

(C1): Silica particles (particle diameter: 7 nm, specific surface area: 300 $m^2/g$), manufactured by Nippon Aerosil Co., "AEROSIL300"

(Silane Coupling Agent (D))

(D1): Hexamethyldisilazane (HMDZ), manufactured by Gelest, Inc., "HEXAMETHYLDISILAZANE (SIH6110.1)"

(Platinum or Platinum Compound (E))

(E1): Platinum compound, PLATINUM DIVINYLTETRAMETHYLDISILOXANE COMPLEX (in xylene), (manufactured by Gelest, Inc., trade name "SIH6831.2")

(Water (F))

(F1): Pure water (Additive)

(Reaction inhibitor 1): 1-Ethynyl-1-cyclohexanol (manufactured by Tokyo Chemical Industry Co., Ltd.)

(Metallic Powder (G))

(G1): Silver powder, manufactured by Tokuriki Honten Co., Ltd., trade name "TC-101", median diameter $d_{50}$: 8.0 μm, aspect ratio: 16.4, average major axis: 4.6 μm (Synthesis of Vinyl Group-Containing Organopolysiloxane (A))

[Synthesis Scheme 1: Synthesis of First Vinyl Group-Containing Straight-Chain Organopolysiloxane (A1-1)]

The first vinyl group-containing straight-chain organopolysiloxane (A1-1) was synthesized according to Formula (5).

That is, octamethylcyclotetrasiloxane (74.7 g, 252 mmol) and potassium siliconate (0.1 g) were fed into an Ar gas-substituted 300 mL separable flask having a cooling pipe and a stirring blade, heated, and stirred at 120° C. for 30 minutes. At this time, an increase in the viscosity could be confirmed.

After that, the components were heated up to 155° C. and continuously stirred for three hours. In addition, after three hours, 1.3-divinyltetramethyldisiloxane (0.1 g, 0.6 mmol) was added thereto, and, furthermore, the components were stirred at 155° C. for four hours.

Furthermore, after four hours, the components were diluted with toluene (250 mL) and then cleaned with water three times. An organic layer after cleaning was re-precipitated and purified by being cleaned with methanol (1.5 L) several times, and an oligomer and a polymer were separated from each other. The obtained polymer was dried at reduced pressure for one night at 60° C., thereby obtaining a first vinyl group-containing straight-chain organopolysiloxane (A1-1) (Mw=573,903, Mn=227,734). In addition, the vinyl group content computed by an H-NMR spectrum measurement was 0.13 mol %.

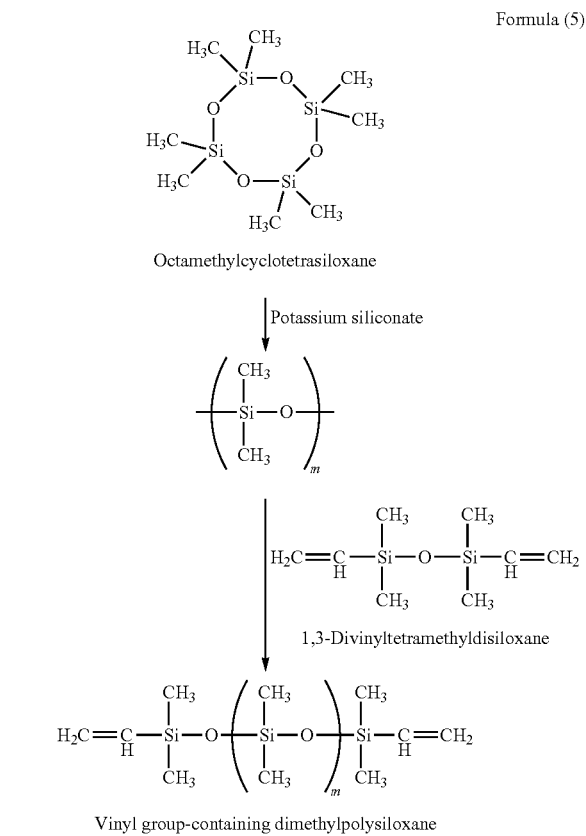

Formula (5)

[Synthesis Scheme 2: Synthesis of Second Vinyl Group-Containing Straight-Chain Organopolysiloxane (A1-2)]

The second vinyl group-containing straight-chain organopolysiloxane (A1-2) was synthesized like Formula (6) in the same manner as the synthesis step of (A1-1) except for the fact that, in the synthesis step of (A1-1), in addition to octamethylcyclotetrasiloxane (74.7 g, 252 mmol), 2,4,6,8-tetramethyl 2,4,6,8-tetravinylcyclotetrasiloxane (0.86 g, 2.5 mmol) was used. In addition, the vinyl group content computed by the H-NMR spectrum measurement was 0.92 mol %.

Formula (6)

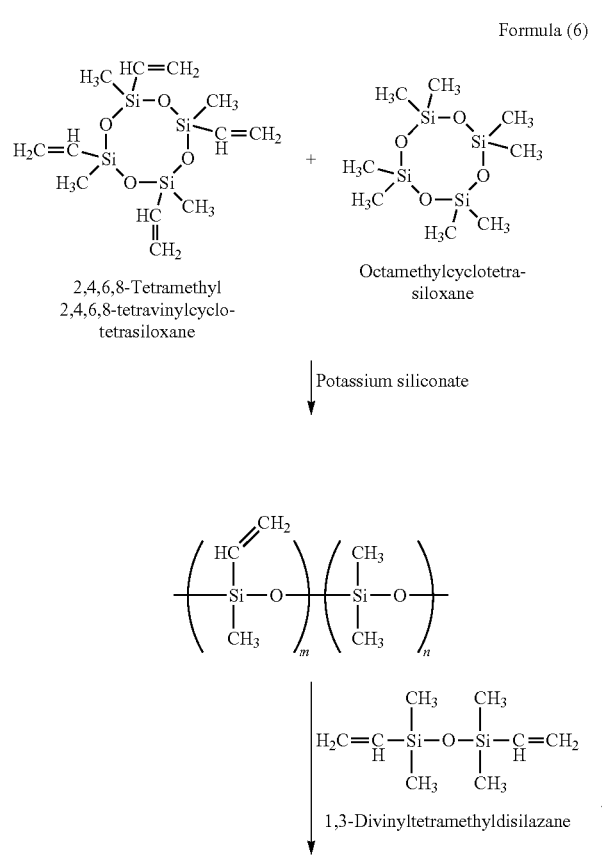

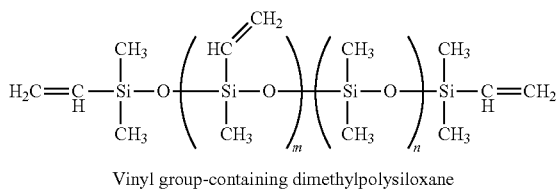

Vinyl group-containing dimethylpolysiloxane

[Production of Conductive Paste]

(Preparation of Silicone Rubber-Based Curable Compositions 1 to 3)

Silicone rubber-based curable compositions 1 to 3 were adjusted as described below. First, a mixture of the vinyl group-containing organopolysiloxane (A) which accounted for 90%, the silane coupling agent (D), and the water (F) was kneaded in advance at ratios shown in Table 1, then, the silica particles (C) were further added to the mixture, and the components were further kneaded, thereby obtaining a kneaded substance (silicone rubber compound).

Here, after the addition of the silica particles (C), the components were kneaded by carrying out a first step of kneading the components in a nitrogen atmosphere for a coupling reaction under a condition of 60° C. to 90° C. for one hour and a second step of kneading the components in a reduced-pressure atmosphere for the removal of a by-product (ammonia) under a condition of 160° C. to 180° C. for two hours and then cooled, the vinyl group-containing organopolysiloxane (A), which accounted for the remaining 10%, was added thereto in two parts, and the components were stirred for 20 minutes.

Subsequently, the organohydrogen polysiloxane (B), the platinum or platinum compound (E), and the reaction inhibitor were added to the obtained kneaded substance (silicone rubber compound) (100 parts by weight) at the ratios shown in Table 1 and kneaded using a roll, thereby obtaining silicone rubber-based curable compositions 1 to 3 (elastomer compositions 1 to 3).

TABLE 1

| | | | | Unit | 1 | 2 | 3 |
|---|---|---|---|---|---|---|---|
| Silicone rubber-based curable composition | Silicone rubber compound (kneaded substance) | Vinyl group-containing organopolysiloxane (A) | (A1-1) | Parts by weight | 58.7 | 46.7 | 79.2 |
| | | | (A1-2) | | 15 | 11.9 | 20.2 |
| | | Silica particles (C) | (C1) | | 18.4 | 29.3 | 0 |
| | | Silane coupling agent (D) | (D1) | | 4.8 | 7.6 | 0 |
| | | Water (F) | (F1) | | 2.6 | 4.1 | 0 |
| | Catalyst | Platinum or platinum compound (D) | (E1) | (Parts by weight with respect to 100 parts by weight of kneaded substance) | 0.03 | 0.03 | 0.04 |
| | Crosslinking agent | Organohydrogen polysiloxane (B) | (B1) | | 0.40 | 0.30 | 0.46 |
| | Additive | Reaction inhibitor | Reaction inhibitor 1 | | 0.07 | 0.07 | 0.1 |

(Elastomer Composition 4)

As an elastomer composition 4, "C6-135 ELASTOMER (including silica particles)" manufactured by Dow Corning Toray Co., Ltd. was used.

(Elastomer Composition 5)

Urethane diacrylate (manufactured by Toagosei Co., Ltd., trade name "ARONIX M-1200") (9.2 g), silica particles (manufactured by Aerosil Co., "AEROSIL300") (3.5 g) that were surface-treated with a silane coupling agent (hexamethyldisilazane (manufactured by Gelest, Inc.) (0.9 g), and an organic peroxide initiator (manufactured by NOF Corporation, trade name "PERHEXA 3M") (0.1 g) were mixed together, thereby obtaining an elastomer composition 5.

Example 1: Conductive Paste 1

The obtained silicone rubber-based curable composition 1 (elastomer composition 1) (13.7 parts by weight) was immersed in tetradecane (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 1.

Example 2: Conductive Paste 2

The obtained silicone rubber-based curable composition 2 (elastomer composition 2) (13.7 parts by weight) was immersed in decane (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 2.

Example 3: Conductive Paste 3

The obtained silicone rubber-based curable composition 1 (elastomer composition 1) (13.7 parts by weight) was immersed in toluene (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 3.

Example 4: Conductive Paste 4

The obtained elastomer composition 4 (including silica particles (3.0 parts by weight)) (13.7 parts by weight) was immersed in decane (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 4.

Example 5: Conductive Paste 5

The obtained elastomer composition 5 (13.7 parts by weight) was immersed in toluene (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 5.

Example 6: Conductive Paste 6

The obtained elastomer composition 1 (13.7 parts by weight) was immersed in mesitylene (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 6.

Example 7: Conductive Paste 7

The obtained elastomer composition 2 (13.7 parts by weight) was immersed in dipropylene glycol dimethyl ether (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 7.

Example 8: Conductive Paste 8

The obtained elastomer composition 1 (13.7 parts by weight) was immersed in diethyl carbonate (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 8.

Example 9: Conductive Paste 9

The obtained elastomer composition 1 (12.0 parts by weight) was immersed in tetradecane (32.4 parts by weight) and, subsequently, stirred using a planetary mixer, the silver powder G1 (55.6 parts by weight) was added thereto, and then the components were kneaded using a triple-roll, thereby obtaining a liquid-state conductive paste 9.

Example 10: Conductive Paste 10

The obtained elastomer composition 2 (15.5 parts by weight) was immersed in decane (32.6 parts by weight) and, subsequently, stirred using a planetary mixer, the silver powder G1 (51.9 parts by weight) was added thereto, and then the components were kneaded using a triple-roll, thereby obtaining a liquid-state conductive paste 10.

Comparative Example 1: Elastomer Composition

The obtained elastomer composition 1 (including the silica particles (C) (5.2 parts by weight)) (20 parts by weight) was not immersed in a solvent, the silver powder G1 (80 parts by weight) was added thereto, then, the components were kneaded using a triple-roll, and the product was used as a sample of Comparative Example 1.

Comparative Example 2: Conductive Paste 11

The obtained elastomer composition 3 (not including the silica particles (C)) (13.7 parts by weight) was immersed in tetradecane (31.8 parts by weight) and, subsequently, stirred using a planetary mixer, the silver powder G1 (54.5 parts by weight) was added thereto, and then the components were kneaded using a triple-roll, thereby obtaining a liquid-state conductive paste 11.

TABLE 2

| Conductive paste | | Unit | Example 1 | Example 2 | Example 3 | Example 4 | Example 5 | Example 6 | Example 7 | Example 8 | Example 9 | Example 10 | Comparative Example 11 | Comparative Example 12 |
|---|---|---|---|---|---|---|---|---|---|---|---|---|---|---|
| | Number | | 1 | 2 | 3 | 4 | 5 | 6 | 7 | 8 | 9 | 10 | — | 11 |
| Elastomer composition | Elastomer composition 1 | Parts by weight | 13.7 | | 13.7 | | | 13.7 | | 13.7 | 12 | | 20 | |
| | Elastomer composition 2 | | | 13.7 | | | | | 13.7 | | | 15.5 | | |
| | Elastomer composition 3 | | | | | | | | | | | | | 13.7 |
| | Elastomer composition 4 | | | | | 13.7 | | | | | | | | |
| | Elastomer composition 5 | | | | | | 13.7 | | | | | | | |
| | Content of silica particles (C) in elastomer composition | | 3.5 | 5.1 | 3.5 | 3.0 | 3.5 | 3.5 | 5.1 | 5.1 | 3.1 | 5.8 | 5.2 | 0 |
| Conductive filler | Metallic powder (G) | Silver powder G1 | 54.5 | 54.5 | 54.5 | 54.5 | 54.5 | 54.5 | 54.5 | 54.5 | 55.6 | 51.9 | 80 | 54.5 |
| Solvent | Tetradecane | | 31.8 | | | | | | | | 32.4 | | | 31.8 |
| | Decane | | | 31.8 | | 31.8 | | | | | | 32.6 | | |
| | Toluene | | | | 31.8 | | 31.8 | | | | | | | |
| | Mesitylene | | | | | | | 31.8 | | | | | | |
| | Dipropylene glycol dimethyl ether | | | | | | | | 31.8 | | | | | |
| | Diethyl carbonate | | | | | | | | | 31.8 | | | | |
| Total | | | 100 | 100 | 100 | 100 | 100 | 100 | 100 | 100 | 100 | 100 | 100 | 100 |
| Viscosity | | Pa·s | 30 | 22 | 20 | 16 | 10 | 25 | 23 | 27 | 28 | 23 | — | 25 |
| Thixotropy index | | | 1.8 | 1.7 | 1.7 | 1.5 | 1.6 | 1.7 | 1.8 | 1.8 | 1.9 | 1.6 | — | 1.5 |
| Volume resistivity | | $\Omega \times 10^{-4}$ | 1 | 2 | 1 | 5 | a | 3 | 5 | 4 | 0.7 | 9 | — | 2 |
| Printability | | | A | A | B | B | B | B | B | B | A | A | — | B |
| Durability | | | A | A | A | A | B | A | A | A | B | B | — | C |

Regarding the Hansen solubility parameters (HSP) of the solvents in Table 2, for tetradecane, the dispersion term ($\delta_d$) was 15.8 MPa$^{1/2}$, the polarity term ($\delta_p$) was 0 MPa$^{1/2}$, and the hydrogen bond term ($\delta_h$) was 0 MPa$^{1/2}$, for decane, the dispersion term ($\delta_d$) was 15.7 MPa$^{1/2}$, the polarity term ($\delta_p$) was 0 MPa$^{1/2}$, and the hydrogen bond term ($\delta_h$) was 0 mpa$^{1/2}$, for toluene, the dispersion term ($\delta_d$) was 17.8 MPa$^{1/2}$, the polarity term ($\delta_p$) was 3.0 MPa$^{1/2}$, and the hydrogen bond term ($\delta_h$) was 0 MPa$^{1/2}$, for mesitylene, the dispersion term ($\delta_d$) was 18.0 MPa$^{1/2}$, the polarity term ($\delta_p$) was 0.6 MPa$^{1/2}$, and the hydrogen bond term ($\delta_h$) was 0.6 MPa$^{1/2}$, for dipropylene glycol dimethyl ether, the dispersion term ($\delta_d$) was 15.1 MPa$^{1/2}$, the polarity term ($\delta_p$) was 6.3 MPa$^{1/2}$, and the hydrogen bond term ($\delta_h$) was 4.9 MPa$^{1/2}$, and, for diethyl carbonate, the dispersion term ($\delta_d$) was 15.7 MPa$^{1/2}$, the polarity term ($\delta_p$) was 5.1 MPa$^{1/2}$, and the hydrogen bond term ($\delta_h$) was 3.5 MPa$^{1/2}$. In addition, the boiling point of tetradecane was 253° C., the boiling point of decane was 174° C., the boiling point of toluene was 111° C., the boiling point of mesitylene was 165° C., the boiling point of dipropylene glycol dimethyl ether was 175° C., and the boiling point of diethyl carbonate was 126° C.

In addition, "—" for Comparative Example 1 in Table 2 indicates that it was not possible to carry out the application operation on the sample of Comparative Example 1, and thus the respective evaluation items could not be measured. Therefore, the sample of Comparative Example 1 could not be used as a paste and was determined to be poor in applicability or printability.

[Evaluation of Conductive Pastes]

The obtained conductive pastes 1 to 11 were evaluated according to the following items.

<Viscosity>

For the obtained conductive pastes, the viscosity at a room temperature (25° C.) and a shear rate of 20 [1/s] was measured using TPE-100H manufactured by Toki Sangyo Co., Ltd. immediately after the production of the conductive paste. The unit of the viscosity was Pa·s.

<Thixotropy Index>

For the obtained conductive pastes, the viscosity measured at a room temperature (25° C.) and a shear rate of 1 [1/s] using TPE-100H manufactured by Toki Sangyo Co., Ltd. was represented by η1, the viscosity measured at a room temperature (25° C.) and a shear rate of 5 [1/s] was represented by η5, and the viscosities were measured respectively immediately after the production of the conductive paste. The unit of the viscosity was Pa·s. The thixotropy index was obtained as a viscosity ratio (η1/η5).

<Volume Resistivity Measurement>

The conductive pastes obtained in the respective examples and the respective comparative examples were applied onto glass slides in an area of 10 mm×10 mm and a thickness of 60 μm and cured in an oven (170° C.) for 120 minutes, and the volume resistivity of the cured substances was measured using a four-probe method. The results are shown in Table 2.

<Printability Evaluation>

The conductive pastes of the examples and the comparative examples were pattern-printed on silicone rubber using a stencil plate having an aperture L/S=500/500 μm such that the heights after curing at 170° C. for 120 minutes were in a range of approximately 50 to 100 µm. The conductive pastes were observed using an optical microscope and evaluated as A when there were no blurs in the obtained pattern, evaluated as B when there were blurs of equal to or longer than 50 µm in equal to or less than 10 places, and evaluated as C when there was a short circuit or wire break. The results are shown in Table 2.

(Durability Test)

First, the obtained silicone rubber-based curable composition 1 (elastomer composition 1) was cured at 170° C. for 120 minutes and formed in a sheet shape, thereby producing a substrate having a width of 2 cm, a height of 500 µm, and a length of 5 cm which was formed of silicone rubber.

Subsequently, wiring patterns were drawn on the obtained substrate using the conductive pastes obtained in the respective examples and the respective comparative examples and cured under conditions of 170° C. for 120 minutes, thereby producing test specimens having the wiring pattern having a width of 500 µm, a height of 50 µm, and a length of 30 mm.

On the test specimens obtained as described above, an operation of stretching the test specimen 20% in the longitudinal direction of the test specimens and release the test specimens was carried out 1,000 times.

Test specimens were evaluated as A when the wires were sufficiently electrically conductive even after 1,000 times of the stretching operation, evaluated as B when the wires were sufficiently electrically conductive even after 500 times of the stretching operation, and evaluated as C when a wire broke after 500 times of the stretching operation. The results are shown in Table 2.

It was found that the conductive pastes obtained in Examples 1 to 10 were capable of realizing conductive resin films that were more favorable in applicability and printability than Comparative Example 1 and more favorable in stretch durability than Comparative Example 2. It was found that such conductive pastes obtained in Examples 1 to 10 were suitable for the formation of stretchable wires.

Examples 11 to 20: Conductive Pastes 12 to 21

The silicone rubber-based curable composition 1 (elastomer composition 1) obtained above (13.7 parts by weight) was immersed in tetradecane (31.8 parts by weight) (solvent) and, subsequently, stirred using a planetary mixer, metallic powder (G) shown in Table 3 (54.5 parts by weight) was added thereto, and then the components were kneaded using a triple-roll, thereby obtaining liquid-state conductive pastes 12 to 21.

TABLE 3

| | | | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Conductive paste | Silicone rubber-based curable composition | Reference sign | 1 | 1 | 1 | 1 | 1 | 1 | 1 | 1 | 1 | 1 |
| | Metallic powder (G) | Reference sign | g1 | g2 | g3 | g4 | g5 | g6 | g7 | g8 | g9 | g10 |
| | Content of metallic powder (G) | wt % | 80 | 80 | 80 | 80 | 80 | 80 | 80 | 80 | 80 | 80 |
| | Solvent | | Tetradecane | Tetradecane | Tetradecane | Tetradecane | Tetradecane | Tetradecane | Tetradecane | Tetradecane | Tetradecane | Tetradecane |
| Evaluation items | 20% stretch 100-time maximum value (average value) | Ω | 24.0 | 57.0 | 435.3 | 121.7 | 7461.7 | 4395.3 | 1822.5 | 11000.0 | 11000.0 | 11000.0 |
| | 20% stretch 100-time stretched-state resistance (average value) | Ω | 9.8 | 40.2 | 58.3 | 42.3 | 562.9 | 60.5 | 117.5 | 11000.0 | 11000.0 | 198.4 |

A metallic powder g1 to a metallic powder g10 used in Table 3 are shown in Table 4.

TABLE 4

| Metallic powder (G) | | g1 | g2 | g3 | g4 | g5 | g6 | g7 | g8 | g9 | g10 |
|---|---|---|---|---|---|---|---|---|---|---|---|
| Shape | | Silver powder Scale-like | Silver powder Scale-like | Silver powder Scale-like | Silver powder Scale-like | Silver powder Scale-like | Silver powder Scale-like | Silver powder Scale-like | Silver powder Scale-like | Silver powder Scale-like | Silver powder Scale-like |
| Average particle diameter $D_{50}$ | µm | 6.61 | 3.78 | 9.60 | 4.30 | 4.54 | 9.44 | 15.00 | 6.80 | 2.10 | 2.20 |
| Specific surface area | $m^2/g$ | 1.49 | 0.53 | 0.23 | 0.76 | 2.05 | 0.49 | 0.48 | 0.32 | 1.14 | 1.42 |
| Tap density | $g/cm^3$ | 3.64 | 3.5 | 3.51 | 3.92 | 2.73 | 4.76 | 3.80 | 5.88 | 4.08 | 3.80 |

[Evaluation of Conductive Pastes]

The obtained conductive pastes 12 to 21 of Examples 11 to 20 were evaluated according to the following items. The evaluation results are shown in Table 3 and Table 5.

TABLE 5

| | | Example 11 | Example 12 | Example 13 | Example 14 |
|---|---|---|---|---|---|
| 20% stretch 100-time released-state resistance (average value) | Ω | 6.7 | 16.9 | 42.0 | 39.5 |

(Resistance Measurement)

The obtained silicone rubber-based curable composition 1 (elastomer composition 1) was cured at 170° C. for 120 minutes and formed in a sheet shape, thereby producing a "substrate" having a width of 2 cm, a height of 500 μm, and a length of 5 cm which was formed of silicone rubber.

Subsequently, wiring patterns were drawn on the obtained "substrate" using the obtained conductive pastes 12 to 21 and cured under conditions of 170° C. for 120 minutes, thereby producing test specimens having the wiring pattern having a width of 500 μm, a height of 50 μm, and a length of 30 mm.

On these test specimens, a test in which the test specimen was stretched 20% in the length direction for three seconds while measuring the resistance using a DC voltage and current source/monitor (6241A) manufactured by ACD Corporation, held for 10 seconds, released for three seconds, and held for 10 seconds was carried out 100 times.

A change in this resistance value (Ω) was monitored at all times, and the change during this test was analyzed.

"The average value ($R_{top100}$) of the peak tops of resistance value generated from the beginning of the stretching to the end of the release in the first time to the 100th time" was regarded as "the 20% stretch 100-time maximum value (average value)", "the resistance value ($R_{ex100}$) at the end of the stretching in the 100th time" was regarded as "the 20% stretch 100-time stretched-state resistance (average value)", and "the resistance value ($R_{re100}$) at the end of the stretching release in the 100th time" was regarded as "the 20% stretch 100-time released-state resistance (average value)". For the resistance value ($R_{ex100}$) and the resistance value ($R_{re100}$), the test was carried out on three samples, and the average value of three values was regarded as the measurement value.

Figure 3:
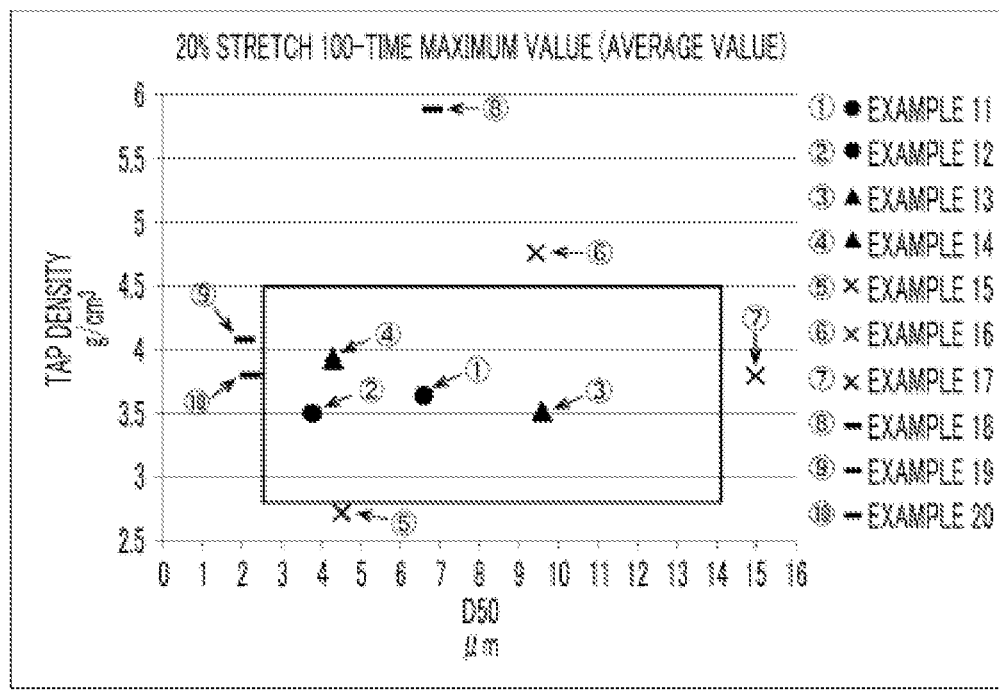
FIG. 3 is a view showing a relationship among "a tap density", "an average particle diameter $D_{50}$", and "an average value ($R_{top100}$)" of a metallic powder (G).
Figure 4:
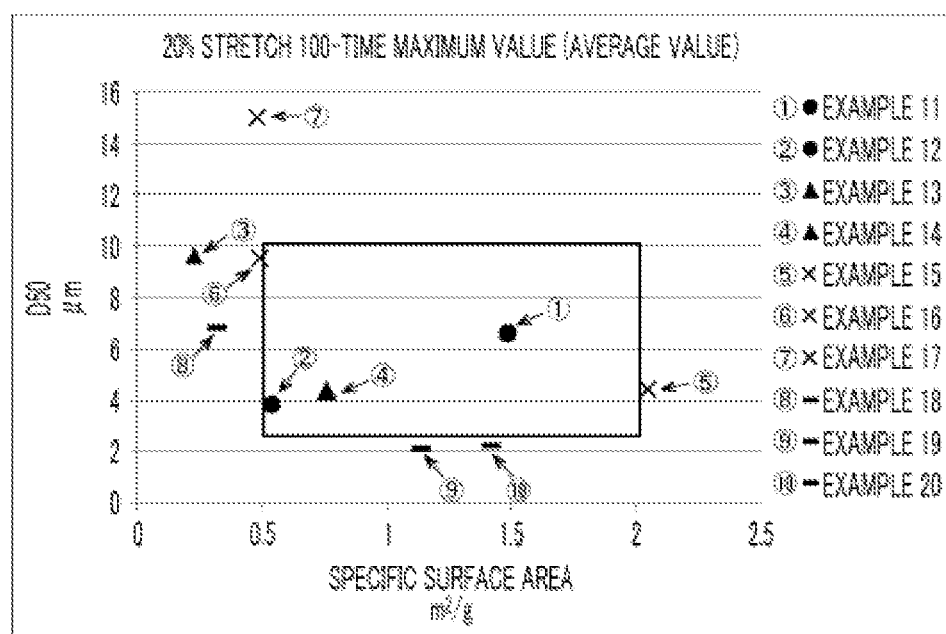
FIG. 4 is a view showing a relationship among "a specific surface area", "the average particle diameter $D_{50}$", and "the average value ($R_{top100}$)" of the metallic powder (G).

In addition, for the conductive pastes 12 to 21, the relationship among "the tap density", "the average particle diameter $D_{50}$", and "the average value ($R_{top100}$)" of the metallic powder (G) is shown in FIG. 3, and, the relationship among "the specific surface area", "the average particle diameter $D_{50}$", and "the average value ($R_{top100}$)" of the metallic powder (G) is shown in FIG. 4.

Regarding "the average value ($R_{top100}$)" in FIGS. 3 and 4, 10 to 99Ω is indicated by "•", 100 to 999Ω is indicated by "▲", 1,000 to 9,999Ω is indicated by "x", and 10,000 to 11,000Ω is indicated by "_".

In addition, the fence line in FIG. 3 indicates a region in which the tap density of the metallic powder (G) is equal to or more than 2.80 g/cm³ and equal to or less than 4.50 g/cm³ and the average particle diameter $D_{50}$ is equal to or more than 2.30 μm and equal to or less than 14.0 μm. The fence line in FIG. 4 indicates a region in which the specific surface area of the metallic powder (G) is equal to or more than 0.50 m²/g and equal to or less than 2.00 m²/g and the average particle diameter $D_{50}$ is 2.30 μm or more and 10.0 μm or less.

It was found that the conductive pastes 12 to 15 of Examples 11 to 14 had a smaller maximum resistance value in the repetitive stretching test than the conductive pastes 16 to 21 of Examples 15 to 20 and are thus capable of realizing a conductive resin film having excellent conduction stability. Therefore, it was found that the conductive pastes of Examples 11 to 14 can be preferably used in the use of devices that are repetitively stretched, specifically, stretchable wires.

It was found that, among these, the conductive pastes of Examples 11, 12, and 14 were more favorable in the conductive property during stretching or the conductive property during the release of stretching after the repetitive stretching test than the conductive paste of Example 13 and are thus capable of realizing a conductive resin film having excellent durability.

This application claims priority based on Japanese Patent Application No. 2017-243901 filed on Dec. 20, 2017, the disclosure of which is incorporated herein in its entirety.

What is claim is:

1. A conductive paste comprising:
   an elastomer composition containing silica particles (C);
   a conductive filler, and
   a solvent,
   wherein the conductive filler includes a scale-like metallic powder (G) having a tap density of equal to or more than 2.80 g/cm³ and equal to or less than 4.50 g/cm³ and an average particle diameter $D_{50}$ of equal to or more than 2.30 μm and equal to or less than 14.0 μm.

2. The conductive paste according to claim 1,
   wherein the elastomer composition includes one or more thermosetting elastomer composition for forming elastomers selected from the group consisting of silicone rubber, urethane rubber, and fluorine rubber.

3. The conductive paste according to claim 1,
   wherein the conductive paste is used to form a wire configuring a stretchable wiring substrate.

4. The conductive paste according to claim 1,
   wherein the solvent includes a high-boiling point solvent having a boiling point of equal to or higher than 100° C. and equal to or lower than 300° C.

5. The conductive paste according to claim 1,
   wherein the solvent includes an aliphatic hydrocarbon having 5 to 20 carbon atoms.

6. The conductive paste according to claim 1,
   wherein the solvent includes a first solvent in which a polarity term ($\delta_p$) of a Hansen solubility parameter is equal to or less than 10 $MPa^{1/2}$.

7. The conductive paste according to claim 1,
   wherein a viscosity of the conductive paste measured at a room temperature (25° C.) and a shear rate of 20 [1/s] is equal to or more than 1 Pa·s and equal to or less than 100 Pa·s.

8. The conductive paste according to claim 1,
   wherein, in the conductive paste, when a viscosity measured at a room temperature (25° C.) and a shear rate of 1 [1/s] is represented by η1, and a viscosity measured at a room temperature (25° C.) and a shear rate of 5 [1/s] is represented by η5, a thixotropy index that is a viscosity ratio (η1/η5) is equal to or more than 1.0 and equal to or less than 3.0.

9. The conductive paste according to claim 1,
   wherein the conductive filler includes a metallic powder (G).

10. The conductive paste according to claim 1,
    wherein a content of the conductive filler is equal to or more than 30% by mass and equal to or less than 85% by mass with respect to the entire conductive paste.

11. The conductive paste according to claim 1,
    wherein a content of the silica particles (C) is equal to or more than 1% by mass and equal to or less than 20% by mass with respect to 100% by mass of a total amount of the silica particles (C) and the conductive filler.

12. The conductive paste according to claim 1,
    wherein the elastomer composition includes a silicone rubber-based curable composition.

13. The conductive paste according to claim 12,
    wherein the silicone rubber-based curable composition includes a vinyl group-containing organopolysiloxane (A).

14. The conductive paste according to claim 12,
wherein the silicone rubber-based curable composition further includes an organohydrogen polysiloxane (B).

15. The conductive paste according to claim 12,
wherein the silicone rubber-based curable composition further includes platinum or a platinum compound (E).

16. The conductive paste according to claim 1,
wherein a content of the elastomer composition is equal to or more than 1% by mass and equal to or less than 25% by mass with respect to the entire conductive paste.

17. A conductive paste comprising:
an elastomer composition containing silica particles (C);
a conductive filler, and
a solvent,
wherein the conductive filler includes a scale-like metallic powder (G) having a specific surface area of equal to or more than 0.50 m$^2$/g and equal to or less than 2.00 m$^2$/g and an average particle diameter $D_{50}$ of equal to or more than 2.30 μm and equal to or less than 10.0 μm.

18. The conductive paste according to claim 17,
wherein the elastomer composition includes one or more thermosetting elastomer composition for forming elastomers selected from the group consisting of silicone rubber, urethane rubber, and fluorine rubber.

19. The conductive paste according to claim 17,
wherein the conductive paste is used to form a wire configuring a stretchable wiring substrate.

20. The conductive paste according to claim 17,
wherein the solvent includes a high-boiling point solvent having a boiling point of equal to or higher than 100° C. and equal to or lower than 300° C.

* * * * *